United States Patent
Dean et al.

(10) Patent No.: US 8,477,815 B2
(45) Date of Patent: Jul. 2, 2013

(54) LASER DRIVER

(75) Inventors: Douglas W. Dean, Eagan, MN (US); Jeremy R. Kuehlwein, Woodbury, MN (US)

(73) Assignee: Texas Instruments Incorporated, Dallas, TX (US)

( * ) Notice: Subject to any disclaimer, the term of this patent is extended or adjusted under 35 U.S.C. 154(b) by 110 days.

(21) Appl. No.: 13/227,190

(22) Filed: Sep. 7, 2011

(65) Prior Publication Data

US 2013/0058368 A1    Mar. 7, 2013

(51) Int. Cl.
*H01S 3/00* (2006.01)
(52) U.S. Cl.
USPC .............. 372/38.02; 372/29.014; 372/29.015; 372/38.03; 372/38.1
(58) Field of Classification Search
USPC .................. 372/29.014, 29.015, 38.02, 38.03
See application file for complete search history.

(56) References Cited

U.S. PATENT DOCUMENTS

| | | |
|---|---|---|
| 6,903,891 B1 | 6/2005 | Crawford et al. |
| 2006/0215532 A1* | 9/2006 | Zhao et al. ..................... 369/116 |
| 2009/0268766 A1* | 10/2009 | Ishibashi .................... 372/38.02 |

FOREIGN PATENT DOCUMENTS

EP        0 333 494        9/1989

* cited by examiner

*Primary Examiner* — Dung Nguyen
(74) *Attorney, Agent, or Firm* — Alan A. R. Cooper; Wade J. Brady, III; Frederick J. Telecky, Jr.

(57) ABSTRACT

An apparatus is provided. The apparatus includes a lasing element, a laser driver and logic. The laser driver is configured to drive the lasing element at multiple current levels, and the laser driver includes a switching network, multiple direct current (DC) loops, and an output circuit. The switching network receives a differential input signal, and each DC loop is coupled to the switching network. The output circuit is also coupled to the lasing element, and the logic is coupled to each of the DC current loops, where the logic selects one or more of the DC loops in each (of several) modes. Each mode generates one or more output lasing currents for the lasing element that corresponds to a one or more of the current levels in response to the differential input signal.

20 Claims, 6 Drawing Sheets

LASER DRIVER

TECHNICAL FIELD

The invention relates generally to a laser driver and, more particularly, to a laser driver that can be used for heat assisted magnetic recording.

BACKGROUND

Recently, laser drivers have been incorporated into preamplifiers for hard disc drives (HDDs) so as to perform heat assisted magnetic recording or HAMR. With heat assisted magnetic recording, a laser diode is focused on the media or platter (which is being written to) so as to changes the coercively of the media, making it easier for the writer to write data on the disk. In FIG. 1, a conventional laser driver 100 used for heat assisted magnetic recording can be seen. This laser driver 100 generally comprises switching channels 102-1 and 102-2 and threshold circuit 104 and is generally employed to drive lasing element D1 (which, for example, can be a laser diode).

Turning to FIG. 2, the switching channels 102-1 and 102-2 (labeled 102 for FIG. 2) are shown in greater detail. As shown, the switching channel 102 is generally comprised of a direct current (DC) loop 106, a switching network 108, and a driver 110. The DC loop 106 is able to generate a predetermined current that is used by the switching network 108 as a tail current. Based on the differential input signal INP and INM and this tail current, the switching network 108 is able to generate an output voltage for the driver 116.

Looking first to the DC loop 106, it receives an input current (which is a scaled version of the output current IOUT) from current source 114. Initially, current source 114 sinks this input current from the DC loop 106 so as to drive the gate of transistor Q3 low until transistor Q3 begins conducting current through resistor R4 (which is coupled to supply rail VDD). When current is conducted through resistor R4, a voltage develops across resistor R4, and this voltage is provided to driver 112 (which, as shown, is a class AB driver). The output from driver 112 is then provided to a second driver (which, as shown, is a class A driver that is comprised of resistor R2 and transistor Q2). This second driver (i.e., resistor R2 and transistor Q2) then drives transistor Q1. As the voltage at the base of transistor Q1 decreases, transistor Q1 starts to conduct current through resistor R1. The DC loop 106 can then settle at a point such that all of the input current is conducted through transistor Q1 and resistor R1 from supply rail VDD. At steady state, the current through resistor R4 and transistor Q3 (which, as shown, is a PMOS transistor) is provided to transistor Q4 (which, as shown, is diode-connected) and resistor R3 so as to be mirrored by transistor Q0 and resistor R9 (which can function as an adjustable current source that is controlled by transistor Q4) of switching network 108. Additionally, capacitor C1 is used to set a dominant pole in the DC loop 106 to improve stability.

Now, turning to the switching network 108, it employs current mode inputs to steer the appropriate current to driver 116. Namely, the bases of transistors Q5 and Q6 (which, as shown, are NPN transistors) receive a reference voltage REF, while the differential input signal INM/INP is received at the emitters of transistors Q5 and Q6. For this configuration, resistor R5 sets the common-mode voltage. When the positive portion INP is "logic high" (allows transistor Q5 to conduct), a current flows through resistors R5 and R7 and transistor Q5, and another current flows through resistors R5 and R8 to the base of transistor Q8. Under these circumstances and because transistors Q7 and Q8 function as a differential pair that receives the tail current from transistor Q0 and resistor R9, the base voltage of transistor Q8 is greater than the base voltage of transistor Q7, which allows current to be conducted through resistor R6 and transistor Q8, activating driver 110. Alternatively, when the negative portion INM is "logic high" (allows transistor Q6 to conduct), a current flows through resistors R5 and R8 and transistor Q6, and another current flows through resistors R5 and R7 to the base of transistor Q7. Under these circumstances, the base voltage of transistor Q7 is greater than the base voltage of transistor Q8, which allows current to be conducted through resistor transistor Q7, allowing the current across resistor R6 to go to zero and deactivating driver 110. The voltage that develops across resistor R6 is then scaled or amplified by driver 116 (which, as shown, is a class AB driver), an emitter follower (which, as shown, comprises resistor R10 and transistor Q9), and a common emitter amplifier (which, as shown, comprises transistor Q11 and resistor R11).

Turning to FIG. 3, threshold channel 104 can be seen in greater detail. The threshold channel 104 is coupled switching channels 102-1 and 102-2 at a common node (which is also coupled to diode D1) and provides a generally constant current from current mirror Q13/Q14 (which is coupled to resistors R12 and R13 and current source 118). This common node can then provide the output current TOUT to the lasing element D1 (i.e., laser diode), where the threshold channel 104 generally provides a threshold current and switching channels 102-1 and 102-2 provide additional currents.

This configuration (which is shown in FIGS. 1-3), however, has several drawbacks. Because transistors Q11 and Q12 are coupled in parallel, the output capacitance is quite large, reducing the data rate capability. Additionally, the repeated class AB drivers (i.e., driver 116) for each switching channel (i.e., 102-1) consumes a large amount of area. Therefore, there is a need for an improved driver.

Some other conventional circuits are: European Patent No. EP0333494; and U.S. Pat. No. 6,903,891.

SUMMARY

An embodiment of the present invention, accordingly, provides an apparatus. The apparatus comprises a lasing element; and a laser driver that is configured to drive the lasing element at a plurality of current levels, wherein the laser driver has: a switching network that receives a differential input signal; a plurality of direct current (DC) loops, wherein each DC loop is coupled to the switching network; an output circuit that is coupled to the lasing element; and logic that is coupled to each of the DC current loops, wherein the logic selects one or more of the DC loops in each of a plurality of modes, and wherein each mode generates one or more output lasing currents for the lasing element that corresponds to a one or more of the plurality of current levels in response to the differential input signal.

In accordance with an embodiment of the present invention, the switching network further comprises: a differential pair of transistors that receives the differential input signal; and an adjustable current source that is coupled to the differential pair of transistors and each DC loop, wherein the adjustable current source provides a tail current for the differential pair of transistors, wherein the one or more DC loops selected by the logic control the adjustable current source.

In accordance with an embodiment of the present invention, the output lasing current is proportional to an output current from the switching network.

In accordance with an embodiment of the present invention, the output circuit further comprises: a first class AB driver that is coupled to the switching network; a second class AB driver that is coupled to the first class AB driver; and a transistor that is coupled to the second class AB driver at its control electrode and that outputs the output lasing current.

In accordance with an embodiment of the present invention, the transistor further comprises a first transistor, and wherein the adjustable current source further comprises a second transistor.

In accordance with an embodiment of the present invention, the each DC loop further comprises: a third transistor; a current source that is coupled to a control electrode of the third transistor; and a control circuit that is coupled to the current source and a passive electrode of the third transistor.

In accordance with an embodiment of the present invention, the control circuit further comprises: a level shifter that is coupled to the passive electrode of the third transistor; and a fourth transistor that is coupled to the current source and the level shifter.

In accordance with an embodiment of the present invention, a first DC loop of the plurality of DC loops further comprises a diode-connected transistor that is coupled to its third transistor and the second transistor.

In accordance with an embodiment of the present invention, the switching network further comprises a resistor that is coupled first class AB driver.

In accordance with an embodiment of the present invention, the lasing element further comprises a laser diode.

In accordance with an embodiment of the present invention, an apparatus is provided. The apparatus comprises a head having a lasing element; an interconnect that is coupled to the head; and a preamplifier having a laser driver that is configured to drive the lasing element at a plurality of current levels, wherein the laser driver has: a switching network that receives a differential input signal; a plurality of DC loops, wherein each DC loop is coupled to the switching network; an output circuit that is coupled to the lasing element; and logic that is coupled to each of the DC current loops, wherein the logic selects one or more of the DC loops in each of a plurality of modes, and wherein each mode generates one or more output lasing currents for the lasing element that corresponds to a one or more of the plurality of current levels in response to the differential input signal.

In accordance with an embodiment of the present invention, the preamplifier further comprises a first supply rail and a second supply rail, and wherein the switching network further comprises: an impedance network that is coupled to the first supply rail; a first bipolar transistor that is coupled to the first supply rail at its collector and the impedance network at its base; a second bipolar transistor that is coupled to the base of the first bipolar transistor at its collector, that receives a reference voltage at its base, and that receives a first portion of the differential input signal at its emitter; a third bipolar transistor that is coupled to the output circuit at its collector and the impedance network at its base; a fourth bipolar transistor that is coupled to the base of the third bipolar transistor at its collector, that receives the reference voltage at its base, and that receives a second portion of the differential input signal at its emitter; and a fifth bipolar transistor that is coupled to each DC loop at its base, the emitters of the first and third bipolar transistors at its collector, and the second supply rail at its emitter.

In accordance with an embodiment of the present invention, the output circuit further comprises: a first class AB driver that is coupled to the collector of the third bipolar transistor; a second class AB driver that is coupled to the first class AB driver; and a sixth bipolar transistor that is coupled to the second class AB driver at its base and that outputs the output lasing current at its collector.

In accordance with an embodiment of the present invention, the each DC loop further comprises: a MOS transistor; a current source that is coupled to a gate of the MOS transistor; and a control circuit that is coupled to the current source and a source of the MOS transistor.

In accordance with an embodiment of the present invention, the control circuit further comprises: a level shifter that is coupled to the source of the MOS transistor; and a seventh bipolar transistor that is coupled to the current source at its collector and the level shifter at its base.

In accordance with an embodiment of the present invention, a first DC loop of the plurality of DC loops further comprises an eighth transistor that is coupled to the drain of its MOS transistor at its base and collector and the base of the fourth bipolar transistor at its base and collector.

In accordance with an embodiment of the present invention, each of the remaining DC loops from the plurality of DC loops further comprises further comprises a current mirror that is coupled to the drain of its MOS transistor.

In accordance with an embodiment of the present invention, the switching network further comprises a resistor that is coupled between the first supply rail and the collector of the third bipolar transistor.

In accordance with an embodiment of the present invention, the switching network further comprises a diode that is coupled between the first supply rail and the resistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
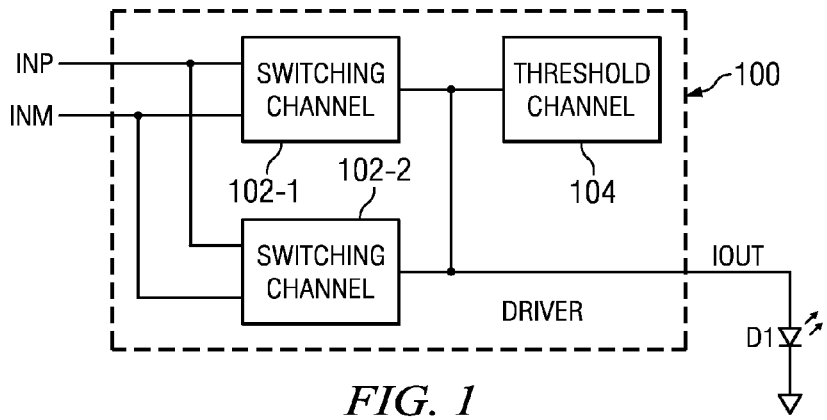
FIGS. 1-3 are diagrams depicting an example of a conventional laser driver.
Figure 3:
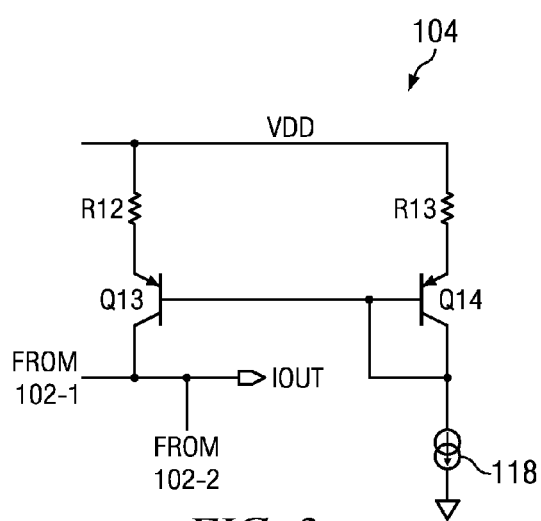

Refer now to the drawings wherein depicted elements are, for the sake of clarity, not necessarily shown to scale and wherein like or similar elements are designated by the same reference numeral through the several views.

Figure 4:
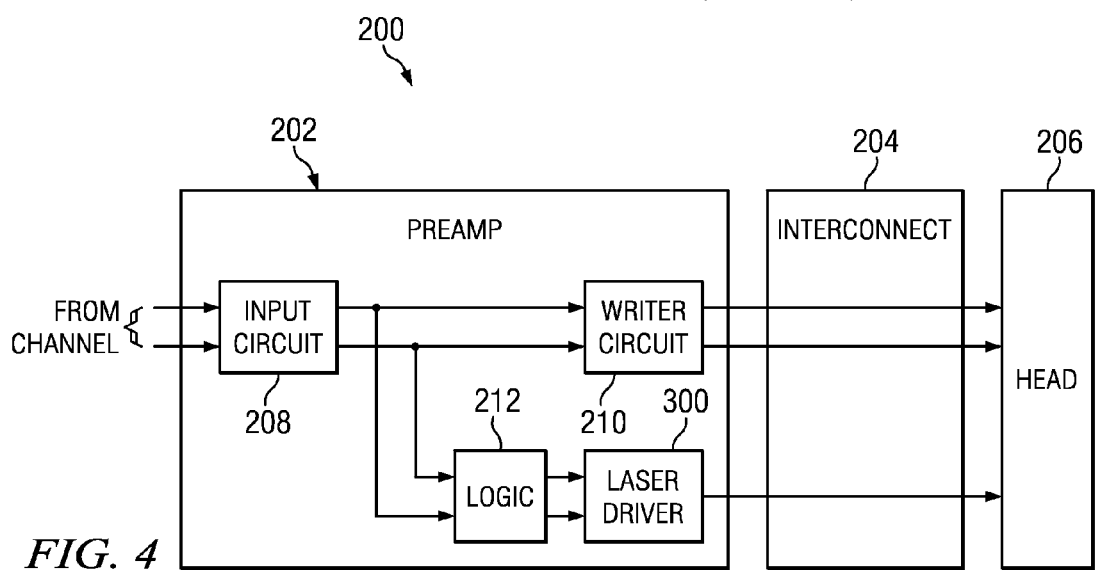
FIG. 4 is a diagram of an example of a system in accordance with an embodiment of the present invention.
Figure 2:
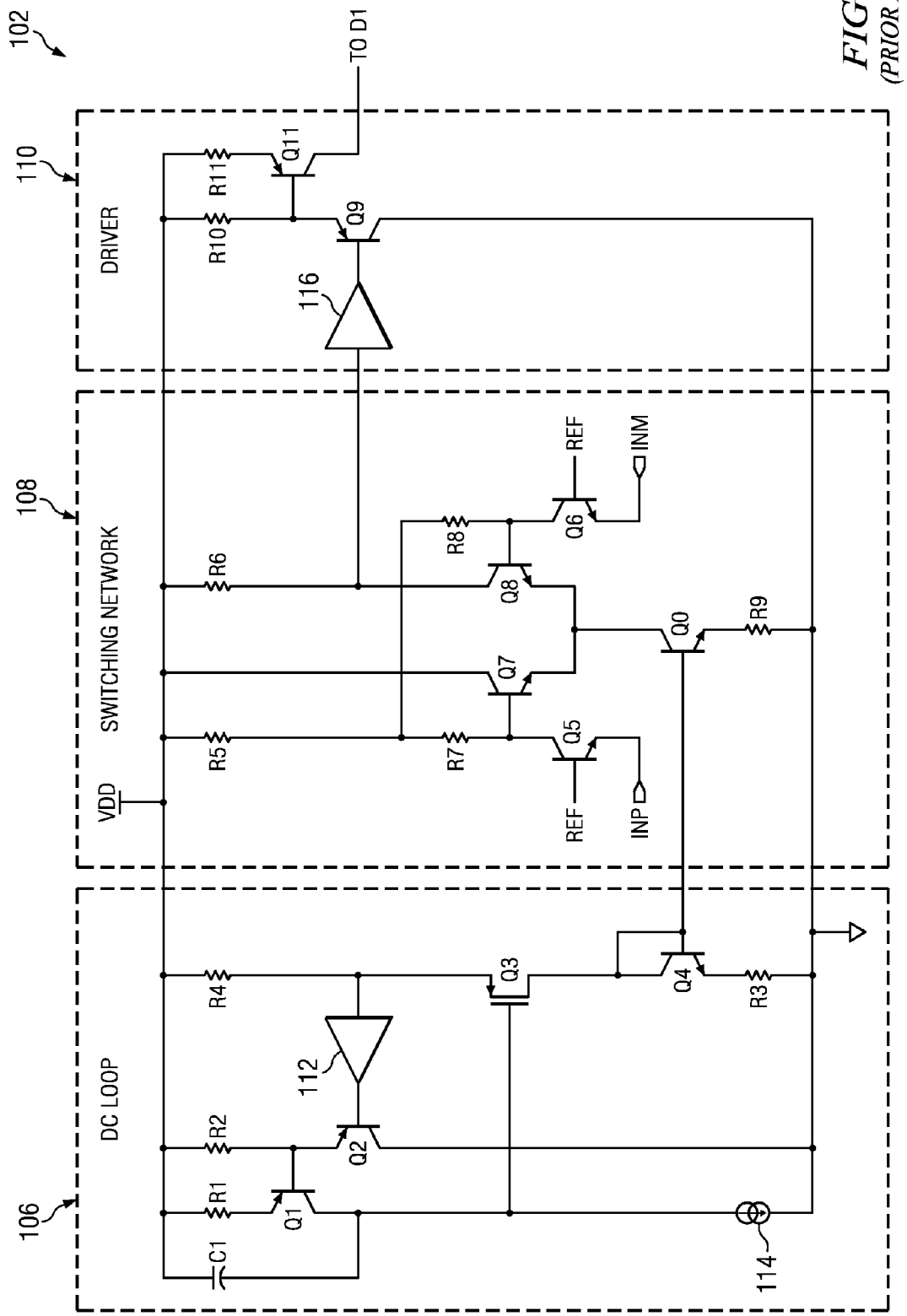

Turning to FIG. 4, an example of a system 200 in accordance with an embodiment of the present invention can be seen. As shown, the system 200 generally comprises a preamplifier 202 that is able to write data to a storage medium (i.e., platter of an HDD) through an interconnect 204 and head 206. The preamplifier or preamp 202 generally comprises input circuit 208, writer circuit 210, logic 212, and laser driver 300. In operation, the input circuit 208 is able to receive a control (i.e., write) signal from the channel and prompt the laser driver 300 through logic 212 (which can, for example, provide a delay) and writer circuit 210 to perform a write operation. Typically, the laser driver 300 is able to activate a lasing element (i.e., laser diode) located in the head 206 to heat the storage medium prior to the generation of a magnetic write operation (by the head 206 in response to the write circuit 210). Additionally and alternatively, the laser driver 300 may also be external to the preamp 202.

Figure 5:
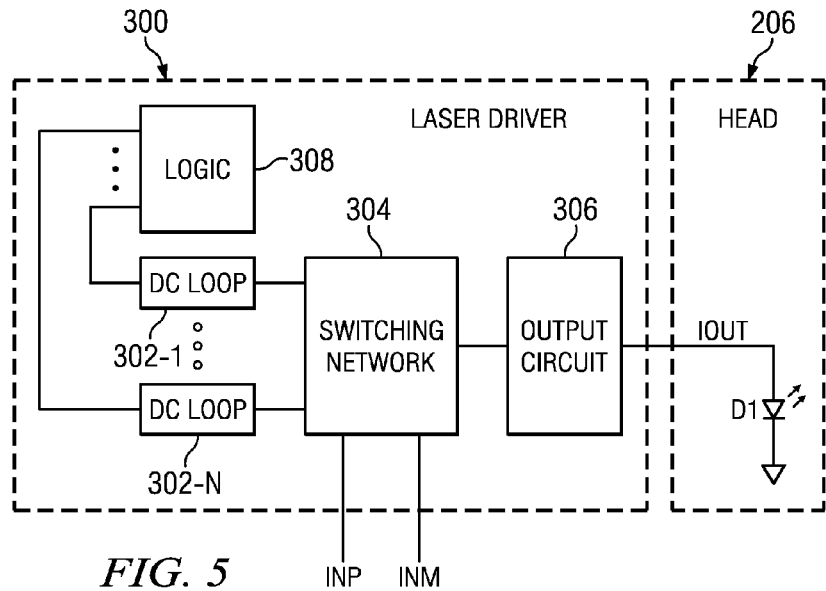
FIG. 5 is a diagram of an example of the laser driver of FIG. 4.
Figure 6:
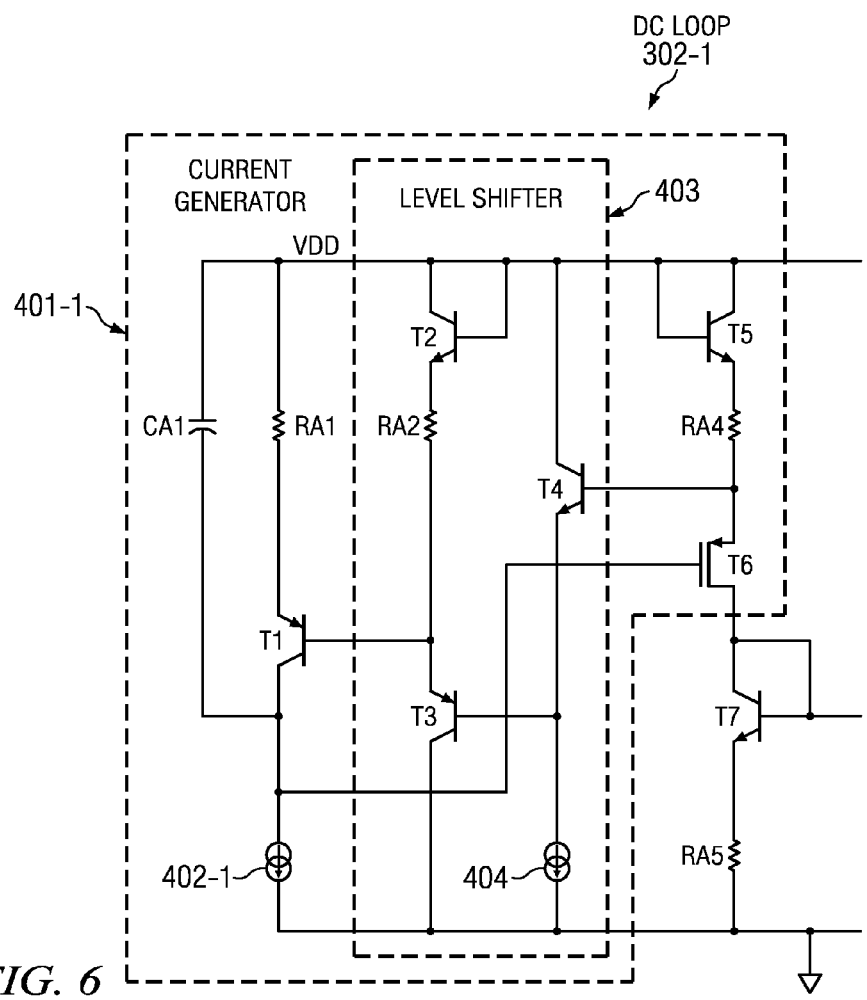
FIGS. 6-8 are diagrams of examples of the DC loops of FIG. 4.
Figure 7:
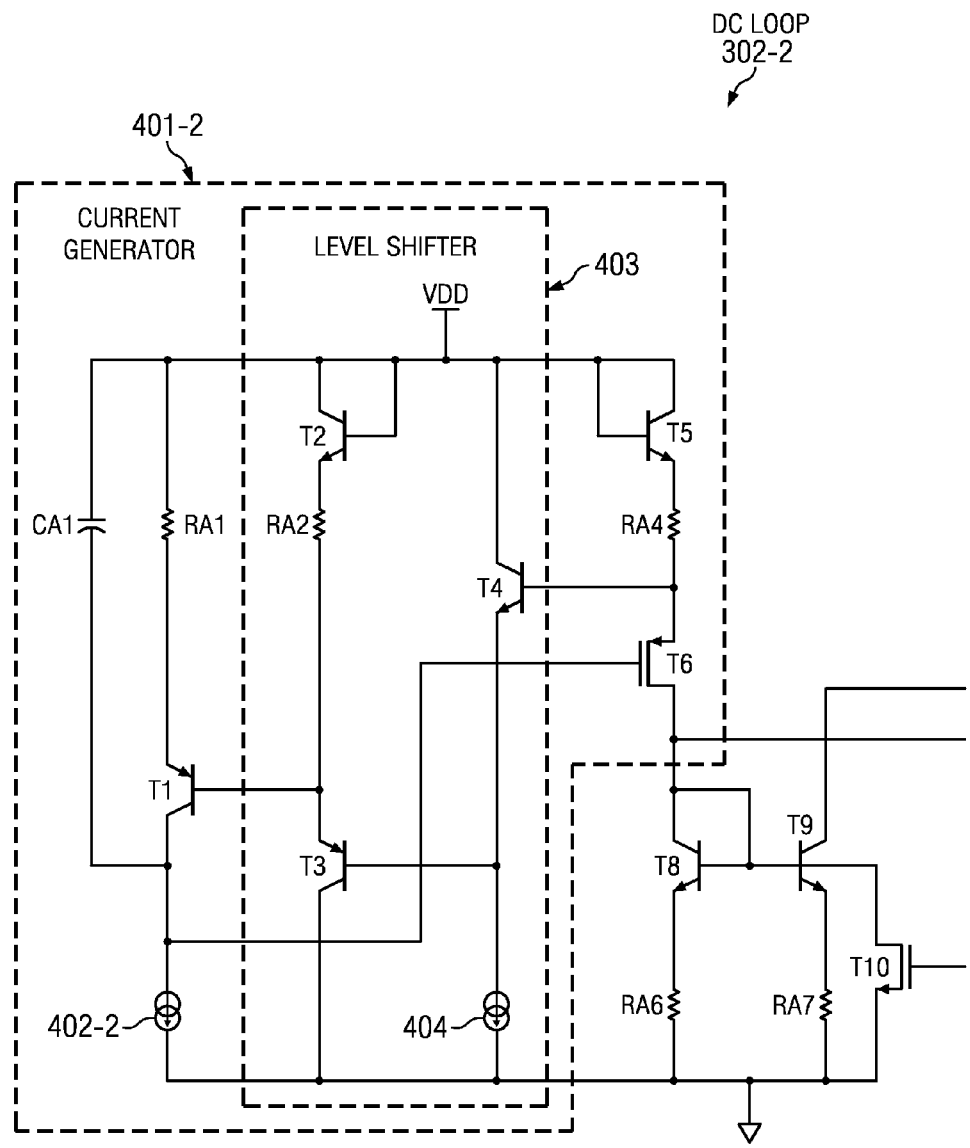
Figure 8:
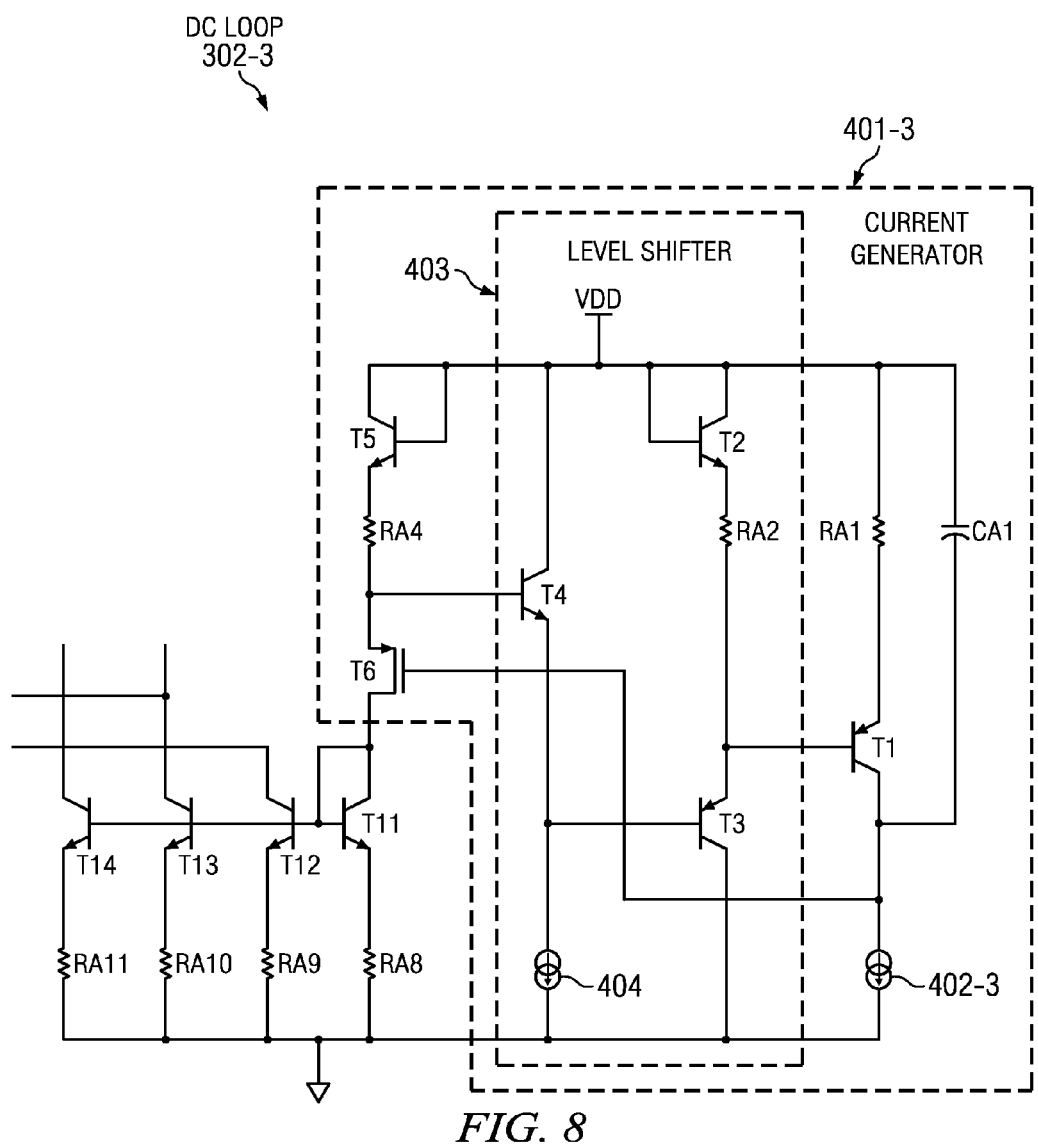

As shown in FIG. 5, the laser driver 300 is generally comprised of DC loops 302-1 to 302-N, a switching network 304, an output circuit 306, and logic 308. Depending on the type of operation performed, different current levels (i.e., emitted energy levels) for the lasing element D1 (i.e., laser diode) may be used. These different current levels are generated through the selection of a combination (i.e., one or more) of DC loops 302-1 to 302-N by logic 308. Based on the combined current from the selected DC loops (i.e., 302-1 and 302-2), the switching network 304 and output circuit 306 can drive the lasing element D1 with output current IOUT. As an example, which is shown in FIGS. 6-9, it can be assumed that laser driver 300 has three different current levels (high, low, and threshold) to drive the lasing element D1, which uses DC loops 302-1 to 302-3.

Turning first to DC loop 302-1 for the example (shown in FIG. 6), it is able to generate a current that is approximately equal to high current IHIGH/K. To generate this current (, i.e., ≈IHIGH/K), current source 402-1 sinks this input current (which can, for example, IHIGH/K) so as to drive the gate of transistor T6 low until transistor T6 begins conducting current through resistor RA4 and diode T5 (which is coupled to supply rail VDD). When current is conducted through resistor RA4 and diode T5, a voltage develops across resistor RA4, and this voltage is provided to the level shifter 403. This level shifter 403 (which includes two back-to-back emitter-followers comprised of transistors T3 and T4, diode T2, resistor RA2, and current source 404) then drives transistor T1. As the voltage at the base of transistor T1 decreases, transistor Q1 starts to conduct current through resistor RA1. The DC loop 302-1 can then settle at a point such that all of the input current is conducted through transistor T1 and resistor RA1 from supply rail VDD. At steady state, the current through resistor RA4 and transistor T6 (which is approximately current IHIGH/K due, for example, to base-emitter voltage differences or $\Delta V_{BE}$ components) is provided to transistor T7 (which, as shown, is diode-connected and which can form a portion of a current mirror) and resistor RA5. Additionally, capacitor CA1 is used to set a dominant pole in the DC loop 302-1 to improve stability.

DC loops 302-2 and 302-3 (shown in FIGS. 7 and 9) have similar functionality to DC loop 302-1, but there are some differences. Namely, DC loops 302-2 and 302-3 generate currents that are approximately equal to currents ITHRESH/K and ILOW/K, respectively, using current sources 402-2 and 402-3 (which can, for example and respectively, generate input currents that are approximately currents ITHREH/K and ILOW/K). Additionally, DC loop 302-2 outputs a current (i.e., ≈ITHRESH/K) to a current mirror (which generally comprises transistors T8 and T9) and resistors RA6 and RA7, and DC loop 302-2 includes transistor T10 (which can be used to deactivate DC loop 302-2). Also, DC loop 302-3 outputs a current that is approximately current ILOW/K to a current mirror (which generally comprises transistors T11 through T14) and resistors RA8 through RA11. The current mirrors used by DC loops 302-2 and 302-3 allow these currents (i.e., ≈IHIGH/K, ≈LOW/K, and ≈ITHRESH/K) to be combined with one another at switching network 304. Additionally, with the configuration shown in example of FIGS. 6-9, the laser driver 300 is able to operation in two modes using three separate current levels: threshold, high, and low.

Figure 9:
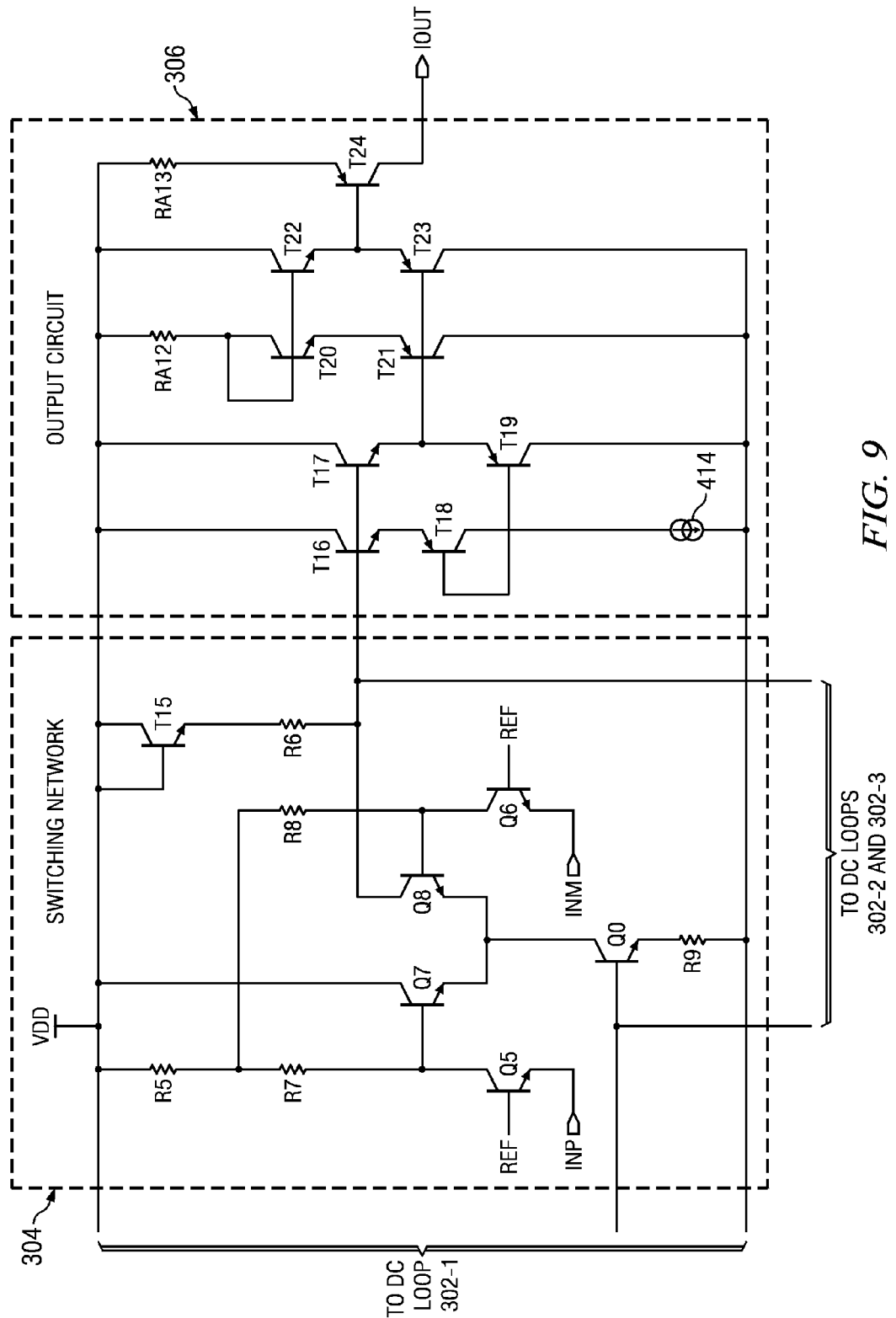
FIG. 9 is a diagram of an example of the switching network and output circuit of FIG. 4.

As shown in FIG. 9, the switching network 304 has a similar configuration to switching network 108. There are some differences, however. Namely, the switching network 304 includes a diode T15 to lower the current used by resistor R6, and the switching network 304 is coupled to the DC loops 302-1 to 302-3 at its output as well as its adjustable current source (i.e., transistor Q0 and resistor R9) to enable multiple current levels for operation.

The output current from the switching network 304 is also usually scaled (i.e., divided by a factor K as described above). To achieve the desired gain (i.e., by a factor K), the output circuit 306, in this example, employs back-to-back class AB amplifiers and a common emitter amplifier. The class AB amplifiers are generally comprised of transistors T16 to T23, current source 414, and resistor RA12, and the common emitter amplifier generally comprises transistor T24 and resistor RA13. To be able to achieve the desired gain, transistor T1 and resistor RA1 are generally the same size for each DC loop 302-1 to 302-3 and are K times smaller than transistor T24 and resistor RA13, respectively.

For the first of these modes for the configuration shown in example of FIGS. 6-9, the laser driver 300 is able to generate a threshold current ITHRESH as the output current TOUT. During this mode, the DC loop 302-1 is deactivated by logic 308, and deactivation of DC loop 302-1 shuts transistor Q0 of the switching network "off." Then, because DC loop 302-3 is active, the current ILOW/K (approximately) is mirrored through transistors T12 and T13. Transistor T13 is able to subtract current ILOW/K (approximately) from current ITHRESH/K (approximately) at the drain of transistor T6 of DC loop 302-2, meaning that current (ITHRESH−ILOW)/K (approximately) is mirrored through transistor T9. Transistor T9 is then coupled to provide current (ITHRESH−ILOW)/K to the input of the output circuit 306, but transistor T13 is coupled to provide current ILOW/K to this input as well. This results in the current ILOW/K (approximately) being "cancelled out" so that output circuit 306 receives current ITHRESH/K (approximately) and produces current ITHRESH at the output.

For the second mode for the configuration shown in example of FIGS. 6-9, the laser driver 300 is able to switch between currents IHIGH and ILOW. During this mode, the DC loop 302-2 is deactivated by logic 308. Because DC loop 302-3 is active, the current ILOW/K is mirrored through transistors T13 and T14. This means that the tail current for differential pair Q7/Q8 of switching network is current (IHIGH−ILOW)/K (approximately) and that current ILOW is provided to the output of the switching network 304. When the positive portion INP is "logic high" (allows transistor Q5 to conduct), a current flows through resistors R5 and R7 and transistor Q5, causing the base voltage of transistor Q8 to be greater than the base voltage of transistor Q7 and allowing output circuit 306 to receive current (IHIGH−ILOW)/K (approximately). Additionally, because the current ILOW/K (approximately) from transistor T13 is provided to the input of the output circuit 306, this current ILOW/K (approximately) is added to current (IHIGH−ILOW)/K (approximately) so that the current output to the output circuit 306 is current IHIGH/K (approximately), and the output current TOUT is current IHIGH. Alternatively, when the negative portion INM is "logic high" (allows transistor Q6 to conduct), a current flows through resistors R5 and R8 and transistor Q6, causing the base voltage of transistor Q7 to be greater than the base voltage of transistor Q8, allowing the output circuit 306 to receive current ILOW/K (approximately), and allowing the output current TOUT to be current ILOW.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a lasing element; and
    a laser driver that is configured to drive the lasing element at a plurality of current levels, wherein the laser driver has:
        a switching network that receives a differential input signal;
        a plurality of direct current (DC) loops, wherein each DC loop is coupled to the switching network;
        an output circuit that is coupled to the lasing element; and
        logic that is coupled to each of the DC current loops, wherein the logic selects one or more of the DC loops in each of a plurality of modes, and wherein each mode generates one or more output lasing currents for the lasing element that corresponds to a one or more of the plurality of current levels in response to the differential input signal.

2. The apparatus of claim 1, wherein the switching network further comprises:
    a differential pair of transistors that receives the differential input signal; and
    an adjustable current source that is coupled to the differential pair of transistors and each DC loop, wherein the adjustable current source provides a tail current for the differential pair of transistors, wherein the one or more DC loops selected by the logic control the adjustable current source.

3. The apparatus of claim 2, wherein the output lasing current is proportional to an output voltage from the switching network.

4. The apparatus of claim 3, wherein the output circuit further comprises:
    a first class AB driver that is coupled to the switching network;
    a second class AB driver that is coupled to the first class AB driver; and
    a transistor that is coupled to the second class AB driver at its control electrode and that outputs the output lasing current.

5. The apparatus of claim 4, wherein the transistor further comprises a first transistor, and wherein the adjustable current source further comprises a second transistor.

6. The apparatus of claim 5, wherein the each DC loop further comprises:
    a third transistor;
    a current source that is coupled to a control electrode of the third transistor; and
    a control circuit that is coupled to the current source and a passive electrode of the third transistor.

7. The apparatus of claim 6, wherein the control circuit further comprises:
    a level shifter that is coupled to the passive electrode of the third transistor; and
    a fourth transistor that is coupled to the current source and the level shifter.

8. The apparatus of claim 7, wherein a first DC loop of the plurality of DC loops further comprises a diode-connected transistor that is coupled to its third transistor and the second transistor.

9. The apparatus of claim 8, wherein the switching network further comprises a resistor that is coupled first class AB driver.

10. The apparatus of claim 9, wherein the lasing element further comprises a laser diode.

11. An apparatus comprising:
    a head having a lasing element;
    an interconnect that is coupled to the head; and
    a preamplifier having a laser driver that is configured to drive the lasing element at a plurality of current levels, wherein the laser driver has:
        a switching network that receives a differential input signal;
        a plurality of DC loops, wherein each DC loop is coupled to the switching network;
        an output circuit that is coupled to the lasing element; and
        logic that is coupled to each of the DC current loops, wherein the logic selects one or more of the DC loops in each of a plurality of modes, and wherein each mode generates one or more output lasing currents for the lasing element that corresponds to a one or more of the plurality of current levels in response to the differential input signal.

12. The apparatus of claim 11, wherein the preamplifier further comprises a first supply rail and a second supply rail, and wherein the switching network further comprises:
    an impedance network that is coupled to the first supply rail;
    a first bipolar transistor that is coupled to the first supply rail at its collector and the impedance network at its base;
    a second bipolar transistor that is coupled to the base of the first bipolar transistor at its collector, that receives a reference voltage at its base, and that receives a first portion of the differential input signal at its emitter;
    a third bipolar transistor that is coupled to the output circuit at its collector and the impedance network at its base;
    a fourth bipolar transistor that is coupled to the base of the third bipolar transistor at its collector, that receives the reference voltage at its base, and that receives a second portion of the differential input signal at its emitter; and
    a fifth bipolar transistor that is coupled to each DC loop at its base, the emitters of the first and third bipolar transistors at its collector, and the second supply rail at its emitter.

13. The apparatus of claim 12, wherein the output circuit further comprises:
    a first class AB driver that is coupled to the collector of the third bipolar transistor;
    a second class AB driver that is coupled to the first class AB driver; and a sixth bipolar transistor that is coupled to the second class AB driver at its base and that outputs the output lasing current at its collector.

14. The apparatus of claim 13, wherein the each DC loop further comprises:
   a MOS transistor;
   a current source that is coupled to a gate of the MOS transistor; and
   a control circuit that is coupled to the current source and a source of the MOS transistor.

15. The apparatus of claim 14, wherein the control circuit further comprises:
   a level shifter that is coupled to the source of the MOS transistor; and
   a seventh bipolar transistor that is coupled to the current source at its collector and the level shifter at its base.

16. The apparatus of claim 15, wherein a first DC loop of the plurality of DC loops further comprises an eighth transistor that is coupled to the drain of its MOS transistor at its base and collector and the base of the fourth bipolar transistor at its base and collector.

17. The apparatus of claim 16, wherein each of the remaining DC loops from the plurality of DC loops further comprises further comprises a current mirror that is coupled to the drain of its MOS transistor.

18. The apparatus of claim 17, wherein the switching network further comprises a resistor that is coupled between the first supply rail and the collector of the third bipolar transistor.

19. The apparatus of claim 18, wherein the switching network further comprises a diode that is coupled between the first supply rail and the resistor.

20. The apparatus of claim 19, wherein the lasing element further comprises a laser diode.

* * * * *